United States Patent [19]

Arnold et al.

[11] 4,408,129

[45] Oct. 4, 1983

[54] CONSTANT ENERGY DRIVE CIRCUIT FOR ELECTROMAGNETIC PRINT HAMMERS

[75] Inventors: Robert W. Arnold, Glen Aubrey; Dean W. Skinner, Binghamton, both of N.Y.

[73] Assignee: International Business Machines Corporation, Armonk, N.Y.

[21] Appl. No.: 274,848

[22] Filed: Jun. 18, 1981

[51] Int. Cl.³ .......................... H03K 3/01; H03K 3/26; H03K 17/26; H03K 5/22

[52] U.S. Cl. .................................... 307/270; 307/494; 307/228; 307/240; 328/147

[58] Field of Search ............... 307/270, 240, 297, 494, 307/228; 328/146, 147; 331/111, 143, 113 A

[56] References Cited

U.S. PATENT DOCUMENTS 3,967,182 6/1976 Scott .............................. 331/113 A
4,123,729 10/1978 Buetemeister ....................... 331/111

*Primary Examiner*—John S. Heyman
*Assistant Examiner*—Timothy P. Callahan
*Attorney, Agent, or Firm*—John S. Gasper

[57] ABSTRACT

A constant energy drive circuit comprises two interconnected chopping circuits successively operable to control the current in a coil of an electromagnetic actuator. One chopping circuit operates during the rise time portion of the operating interval, the other operates beginning with the occurrence of a predetermined peak current and for remainder of the operating interval of fixed duration.

13 Claims, 4 Drawing Figures

CONSTANT ENERGY DRIVE CIRCUIT FOR ELECTROMAGNETIC PRINT HAMMERS

TECHNICAL FIELD

This invention relates to electromagnetic actuators and particularly to a drive circuit for supplying constant energy to an electromagnetic actuator for a print hammer or the like.

RELATED APPLICATION

U.S. application of R. W. Arnold, titled "Constant Energy Drive Circuit For Electromagnetic Print Hammers," Ser. No. 274,933, filed June 18, 1981.

BACKGROUND OF THE INVENTION

Control of electromagnetic actuators particularly for operating print hammers is of crucial importance. In using the energization of a coil to effect a work action such as printing, it is highly desirable to be able to apply the same total amount of energy to the coil every time it is energized. This guarantees that the hammer will impact the print medium with a constant force. It is also desirable or necessary in some print hammer control systems to operate the hammer driver each time for the same interval of time. It is further desirable that the energy level can be easily adjusted to take into account different forms thicknesses used in printing. A number of techniques have been used in the prior art to achieve precision hammer control.

BACKGROUND ART

In the related co-pending application various references are cited showing various drive circuits for print hammers. In the related application, the constant energy drive circuit is designed to operate such that variations in drive voltage are compensated by adjusting the reference voltage used for establishing the threshold signal to the comparator of the chopping circuit. In the related application, the drive circuit energized the coil for a fixed operating interval. During the initial phase of the operating interval, current increases rapidly depending on the magnitude of the voltage source. The current in the electromagnetic coil rises to a predetermined value at a rate dependent on the voltage of the supply plus various circuit operating parameters such as inductance and resistance. The chopping circuit becomes effective at the end of the rise time inverval which can vary as the voltage and circuit parameters vary. The related application adjusts the chopping rate to compensate for any changes in the amount of energy supplied to the hammer during the rise time. In some applications, particularly where an extremely short operating interval is required, it is not always possible to make the adjustment to the reference voltage to compensate for changes in the supply voltage.

Publication of S. D. Kreidl et al. in the IBM Technical Disclosure Bulletin Vol. 15, No. 9, February 1973 at pages 2695, 2696 describes a DC motor torque control using waveform generator and a chopper motor drive circuit for programming the current in the motor.

Publication of D. R. Polk et al. in the IBM Technical Disclosure Bulletin, Vol. 23, No. 10 of March 1981 at pages 4805–4808 describes a total variable energization control for an impact printer hammer in which a waveform generator under control of a microprocessor supplies a tailored waveform to an operational amplifier which biases a transistor in the coil circuit to cause current in the coil to track the contour of the tailored waveform. Chopping circuits are not used.

SUMMARY OF THE INVENTION

In accordance with the invention, a constant energy drive circuit is provided in which the constant total energy supplied to the coil of an electromagnetic actuator is controlled during both the rise time interval of fixed duration and the steady state or remainder portion of the operating interval of fixed duration. Basically, the drive circuit utilizes two chopping circuits interconnected and interacting to operate individually during different portions of the operating interval. The first chopping circuit operates during the rise time portion so that the current in the coil always rises at a controlled rate to the same peak current level at the end of the rise time interval. The second chopping circuit becomes active in response to a predetermined peak current level at the end of the rise time interval and operates to maintain the current in the coil at a predetermined average value for the remainder of the operating interval. Together the two interacting chopping circuits control the total energy at a constant value each time the coil is energized to operate the actuator. Thus it is possible to operate the print hammer in such a way that a constant force will always be delivered for impacting a print medium against type. In addition, means can be provided for adjusting the average level so that more or less energy can be supplied to accommodate the use of various thicknesses of print forms. These and other advantages will be more readily understood by reference to the detailed description and drawings.

DETAILED DESCRIPTION OF THE INVENTION

Figure 1:
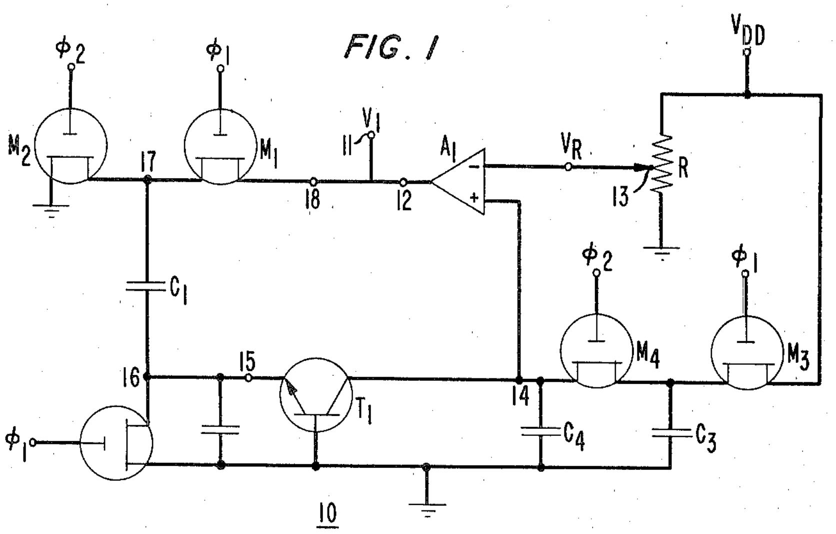
FIG. 1 is a circuit diagram illustrating one embodiment of this invention.

As seen in FIG. 1, coil 10 of an electromagnetic actuator for a print hammer or the like is connected in series circuit with a switch transistor 11 and sense resistor 12 with the emitter of transistor 11 connected to the positive supply voltage +V1 and with the sense resistor 12 connected to ground. The base of transistor 11 is connected for switching purposes via resistor 13 to the collector of a second switch transistor 14 having a grounded emitter. The base of transistor 14 is connected at junction 15 through an inverter 16 to an input terminal 17 for receiving a negative going turn-on signal applied by an external source such as a printer control. Resistor 18 connected to junction 15 and to bias voltage +V sets the switching voltage level for transistor 14.

In accordance with this invention, two chopping circuits are provided for controlling the flow of current in coil 10 and sense resistor 12 during an operating interval of fixed duration when the input turn-on signal is applied to terminal 17. The first chopping circuit comprises comparator 19 having a − input connected at junction 20 to the coil side of sense resistor 12. The + input of comparator 19 is connected to junction 21 of an RC circuit comprising capacitor 22 and resistor 23 connected to a fixed reference voltage $V_R$ at terminal 24. Junction 21 is also connected to the collector of transistor 25 having a grounded emitter and the base connected to input terminal 17. Transistor 25 operates to invert the input signal to control the application of a reference voltage waveform generated by the RC circuit to the + input of comparator 19 for comparison with the voltage drop across sense resistor 12. When the input signal at terminal 17 is up, transistor 25 is closed thereby connecting junction 21 of the RC circuit to ground. Charging of capacitor 22 is prevented and a zero voltage is applied to the + input of comparator 19. When the input signal at terminal 17 goes down, e.g. drops to 0, transistor 25 opens disconnecting junction 21 from ground and connecting capacitor 22 in series with resistor 23. Capacitor 22 thereby begins charging at a rate dependent on the value RC and voltage $V_R$ generating a corresponding voltage at junction 21 for application as a reference waveform to the input of comparator 19. The output of comparator 19 is connected to junction 15 for applying cycling signals for switching transistors 14 and 11 when transistor 14 is enabled by the up signal from inverter 16 for the entire rise time portion of the fixed operating interval of the signal applied to terminal 17.

In the practice of this invention, the value of the RC time constant is selected so that the energy supplied to coil 10 is a constant amount over a constant rise time interval. It is also essential according to this invention that this be achieved notwithstanding variations in the parameters of the coil circuit and power supply caused by changing ambient conditions. To achieve this the value of the RC time constant for resistor 23 and capacitor 22 is made equal to the ratio of the maximum inductance and minimum resistance of coil 10. That is, $RC = L_{max}/R_{min}$.

The RC time constant in the above expression represents the worst case time constant load of coil 10. Thus in accordance with the invention, the rising current in coil 10 is controlled to increase in all instances at this minimum rate under all load parameter variations. As a result, coil 10 will have the ability to always follow the exponential slope of waveform voltage applied by the RC circuit to comparator 19 at junction 21.

One set of circuit parameters useful to practice the invention can be as follows:

Resistor 23 = 51 KΩ
Capacitor 22 = 0.027 μF
$R_{min}$(Coil 10) = 1.3Ω
$L_{max}$(Coil 10) = 5 mH
$V_R$ = 15 V
+V1 = 60 V
+V = 5 V Comparator 19 preferably can be a circuit of the type LM339 described in the National Semiconductor Linear Datebook and manufactured by National Semiconductor. Such a circuit is configured to have 20 mV internal hysteresis (by connecting it up as a schmitt trigger) which causes it to switch across a range of ±10 mV.

The second chopping circuit comprises comparator 26 having a + terminal connection to the coil side of sense resistor 12 at junction 20 in common with the connection from the − input of comparator 19. Thus both comparators 19 and 26 receive a voltage representing the current in the coil circuit consisting of coil 10 and resistor 12. The − input of comparator 26 is connected to junction 27 of a resistance network comprising grounded resistor 28 and resistors 29 and 30. The output of comparator 26 is connected to the base of transistor 31 having a grounded emitter and a collector connected to junction 15. Transistor 31 functions essentially as an inverter of the cycling signals generated by comparator 26. Resistor 32 is connected to the output of comparator 26 at junction 33 and to the positive bias voltage +V and controls the gating level for transistor 31. The current sense signal indicative of the level of current in coil 10 and sense resistor 12 is determined by the voltage drop across sense resistor 12 which is directly related to the current through sense resistor 12 from coil 10 to ground initially when transistor 11 is enabled, i.e. switched to the closed state, by switch transistor 14 and subsequently when transistor 14 is switched open and reverse current from coil 10 flows through blocking diode 35 to ground. The reference signal as described in the related copending application is the dual threshold voltage representing the upper and lower desired levels of current in coil 10 at junction 27 determined by the fixed reference voltage $V_R$ applied to terminal 24 and the voltage drop produced by the combined resistance of the resistance network comprised of resistors 28, 29 and 30. Resistors 28 and 29 essentially function as a voltage divider which determines the voltage drop from $V_R$ to ground. Resistor 30 is a branch resistor which is part of a feedback circuit from comparator 26 to enable the total resistance of the network to be cycled between upper and lower levels to raise or lower the reference voltage at junction 27 and hence at the − input of comparator 26. Specifically, branch resistor 30 is connected in series to the collector of a threshold switch transistor 34 having a grounded emitter with a base connection at junction 33 in the output of comparator 26. Cyclic signals from comparator 26 at junction 33 switch transistor 34 thereby cyclically grounding resistor 30 so that the resistance of the network cycles between upper and lower levels. This in turn produces a cycling of the threshold voltage at junction 27 to the − input of comparator 26. Cycling signals generated by comparator 26 at junction 33 are at the same time inverted by transistor f31 and applied to switching transistor 14 at junction 15 to open and close transistor 14 when enabled by the input turn-on signal generated through inverter 16 thereby causing the cycling for connecting coil 10 to the drive voltage +V1. In this manner, the average peak current value in coil 10 can be controlled during the remainder portion of the operating interval following the rise time portion. The specific parameters for comparator 26 and associated resistors and transistors useful for practicing the invention may be obtained by reference to the copending related application.

Figure 2:
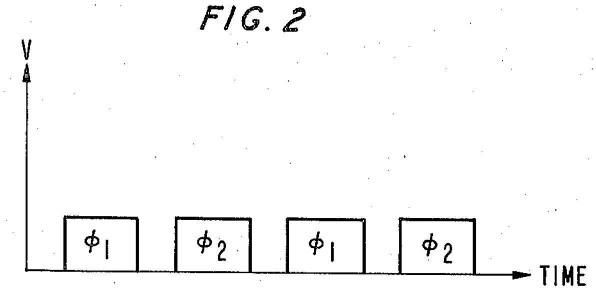
FIG. 2 is a graph showing a waveform of the current in the coil during operation for a specific operating interval by the circuit of FIG. 1.

The operation of the circuit of FIG. 1 referring also to FIG. 2 is as follows:

When the input signal at terminal 17 is up and prior to the beginning of operation at T=0, inverter 16 applies a down signal to junction 15 holding transistor 14 off independently of the state of transistor 31 or the output signal from comparator 19. This in turn holds transistor 11 open thereby disconnecting coil 10 and sense resistor 12 from the supply voltage $+V_1$. Since no current flows in coil 10 and sense resistor 12 a 0 voltage at junction 20 is applied to both the − input of comparator 19 and + input of comparator 26. At the same time transistor 25 connects junction 21 to ground preventing capacitor 22 from charging thus applying 0 volts to the + input of comparator 19. Also prior to the beginning of operation, a positive voltage at junction 27 is applied to the − input of comparator 26. Since no voltage appears at junction 20 comparator 26 produces a down cycle signal at junction 33 which causes transistor 34 to remain open to disconnect branch resistor 30 from the resistance network so that the threshold voltage at junction 27 is at the upper level. With the output from comparator 26 at 0 volts, transistor 31 is open allowing junction 15 to seek the voltage level determined by the condition of inverter 16 which, prior to operation, is down.

Operation begins by the input signal at terminal 17 being switched down, e.g. to 0 volts, at T=0. This turns off transistor 25 allowing capacitor 22 to begin charging at the rate of RC as previously described. At the same time an up signal from inverter 16 is applied to junction 15. This causes transistors 14 and 11 to be enabled thereby causing current to flow in coil 10 and sense resistor 12. The current in coil 10 now rises in accordance with the time constant $L/(R+0.5\Omega)$ towards a final value of $(V_1-V_{ce})/(R+0.5\Omega)$. As the coil current rises, so does the potential across resistor 12 at junction 20 to the − input of comparator 19. At the same time the voltage at junction 21 dependent on the RC time constant increases exponentially and is applied to the + input of comparator 19. When the voltage at junction 20 exceeds the voltage at junction 21 by a predetermined value such as +10 mV, the output from comparator 19 goes down causing transistor 14 to open. This opens transistor 11 disconnecting coil 10 from voltage source +V1. The current in coil 10 immediately begins decaying by flowing through blocking diode 35 to ground so that the voltage at junction 20 also drops proportionately. In the mean time, capacitor 22 continues charging raising the voltage at junction 21 at the RC time constant rate. When the voltage at junction 21 exceeds the decaying voltage of junction 20 at the predetermined difference for example, +10 mV, comparator 19 switches state and applies an up signal to transistor 14 at junction 15. This again connects transistor 11 to the voltage source +V1 causing current to begin flowing in the forward direction through coil 10 and resistor 12. The process is repeated several times during the entire rise time portion $t_r$ of the operating interval as shown in FIG. 2.

At the end of the rise time interval $t_r$, the voltage at junction 20 will have increased to the level at which it equals the voltage at junction 27, namely the threshold voltage applied to comparator 26. At this point in time, comparator 26 generates an output signal which goes up thereby turning on transistor 31 causing junction 15 to go to ground. This turns off transistor 14 which opens transistor 11 disconnecting coil 10 from the voltage source +V1. At the same time comparator 26 turns on transistor 34 connecting network resistor 30 to ground thereby reducing the threshold voltage at junction 27 to the lower level based on the combined resistances 28, 29 and 30. With coil 10 disconnected from voltage source +V1, the current in coil 10 begins to decay flowing through diode 35 to ground. When the voltage at junction 20 decays to the value of the lower threshold voltage at junction 27, comparator 26 switches producing an output signal which goes down to disconnect transistor 31 allowing junction 15 to rise causing transistor 14 to come on. During the remaining portion of the operating interval comparator 26 takes over the chopping of the current in coil 10 in the manner just described. During this period of time, comparator 19 remains off. This is due to the fact that the capacitor 22 continues to charge to a satuartion level which exceeds the maximum voltage appearing at junction 20. As comparator 26 continues to chop the current in coil 10, an average current between the upper and lower peaks of the curve shown in FIG. 2 is maintained. Because of the greater differential voltage seen by comparator 26, its chopping frequency can be much slower than the frequency of comparator 19. At the end of the predetermined operating interval, the input signal at terminal 17 goes up causing inverter 16 to drop the potential at junction 15. This terminates all further action by the chopping circuit through comparator 26 causing transistor 14 to open and to open switch transistor 11 disconnecting coil 10 from the voltage source +V1. The remaining energy stored in coil 10 then discharges through diode 35. Since the rise time interval $t_r$ is fixed and the average rising current follows the RC time constant to the predetermined voltage level at the end of the rise time interval, the amount of energy delivered to coil 10 during interval tr is constant. Likewise, since the chopping of current in coil 10 by comparator 26 and associated circuitry always occurs at the end of that time tr and at the predetermined current level, the chopping during the remainder portion of the operating interval likewise controls the constant energy applied to coil 10. Therefore the total energy to coil 10 is fixed every time it is energized for the fixed operating interval. Both chopping circuits have the inherent capacity to adjust for variations in the coil inductance and resistance as well as changes in voltage +V1. In this way a very precise amount of energy is supplied to the coil 10 for each operating interval.

Figure 3:
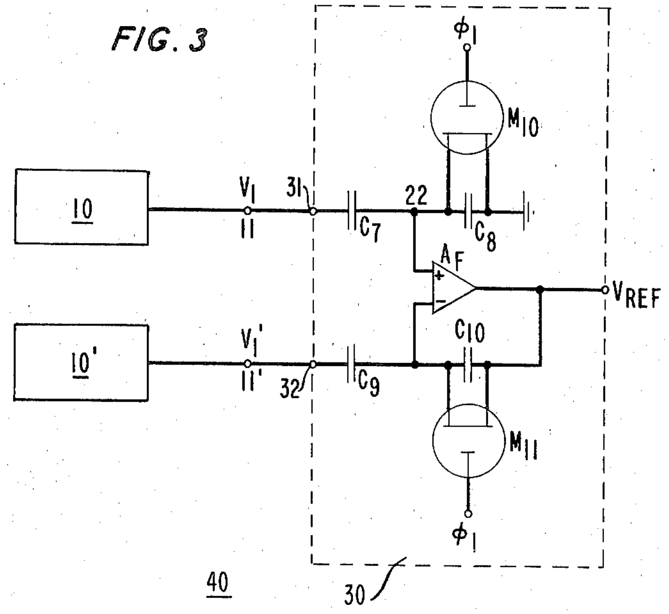
FIG. 3 is a circuit diagram illustrating a second embodiment for practicing the invention.

In the alternative embodiment shown in FIG. 3, the RC circuit for generating the control waveform to comparator 19 to chop the rise time current in coil 10 is replaced with a current source which supplies a constant current $I_c$ at terminal 36 connected to junction 21 to the + input of comparator 19. In all respects, the alternate circuit of FIG. 3 functions in substantially the same way as described for the circuit of FIG. 1 except that the reference waveform is a linear ramp and comparator 19 cycles transistor 14 relative to the linear ramp voltage.

Figure 4:
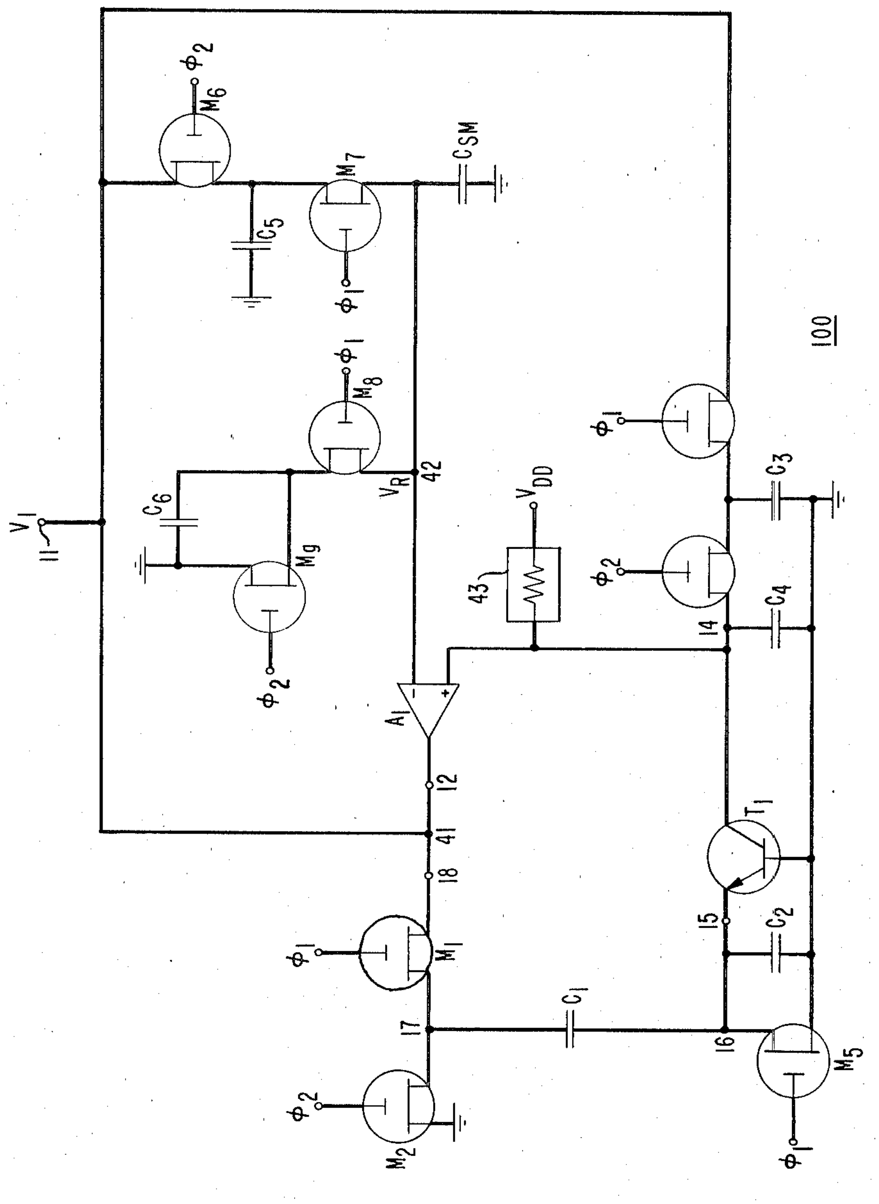
FIG. 4 shows a second waveform generator for use with the circuit of FIG. 3.
Figure 1:
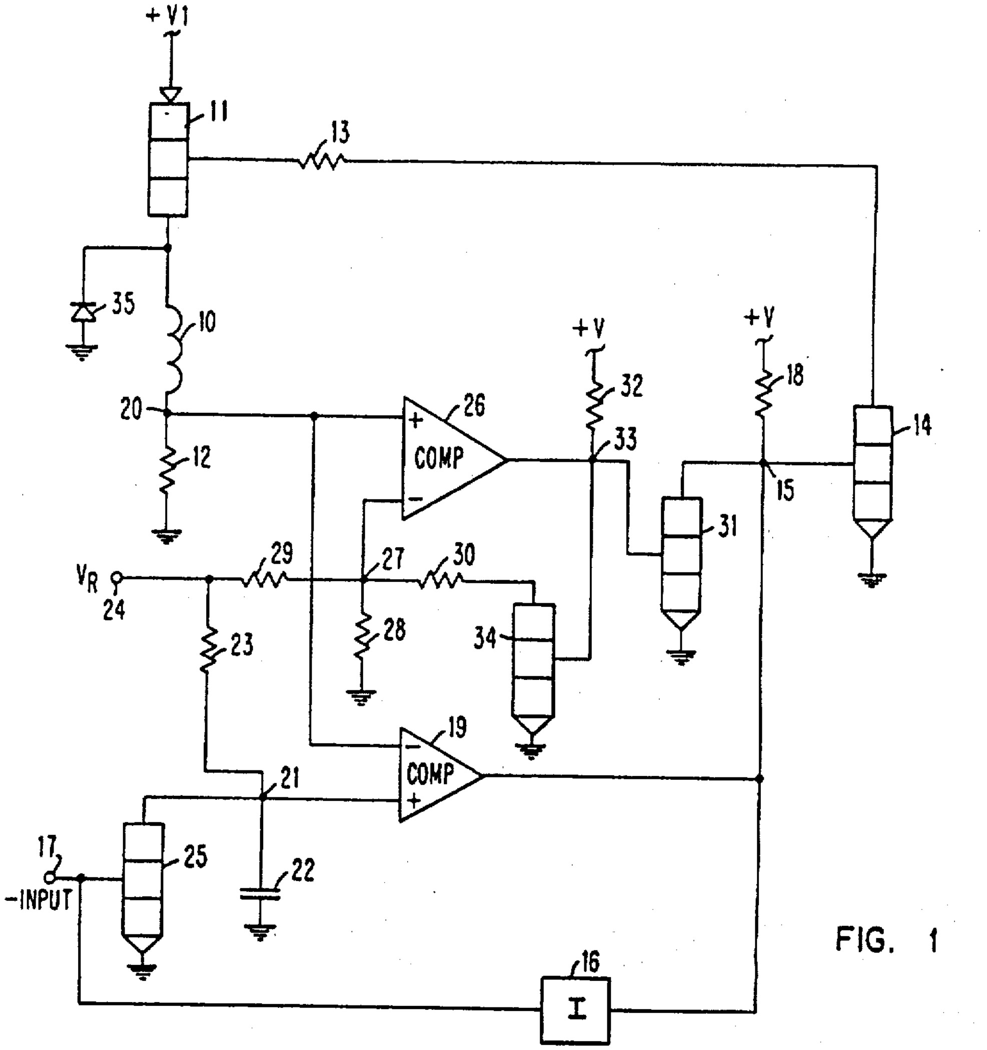
Figure 2:
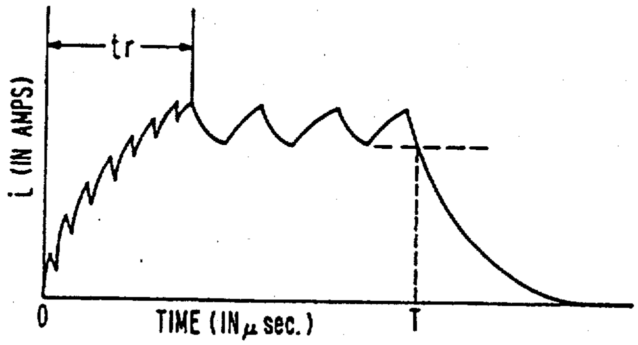
Figure 3:
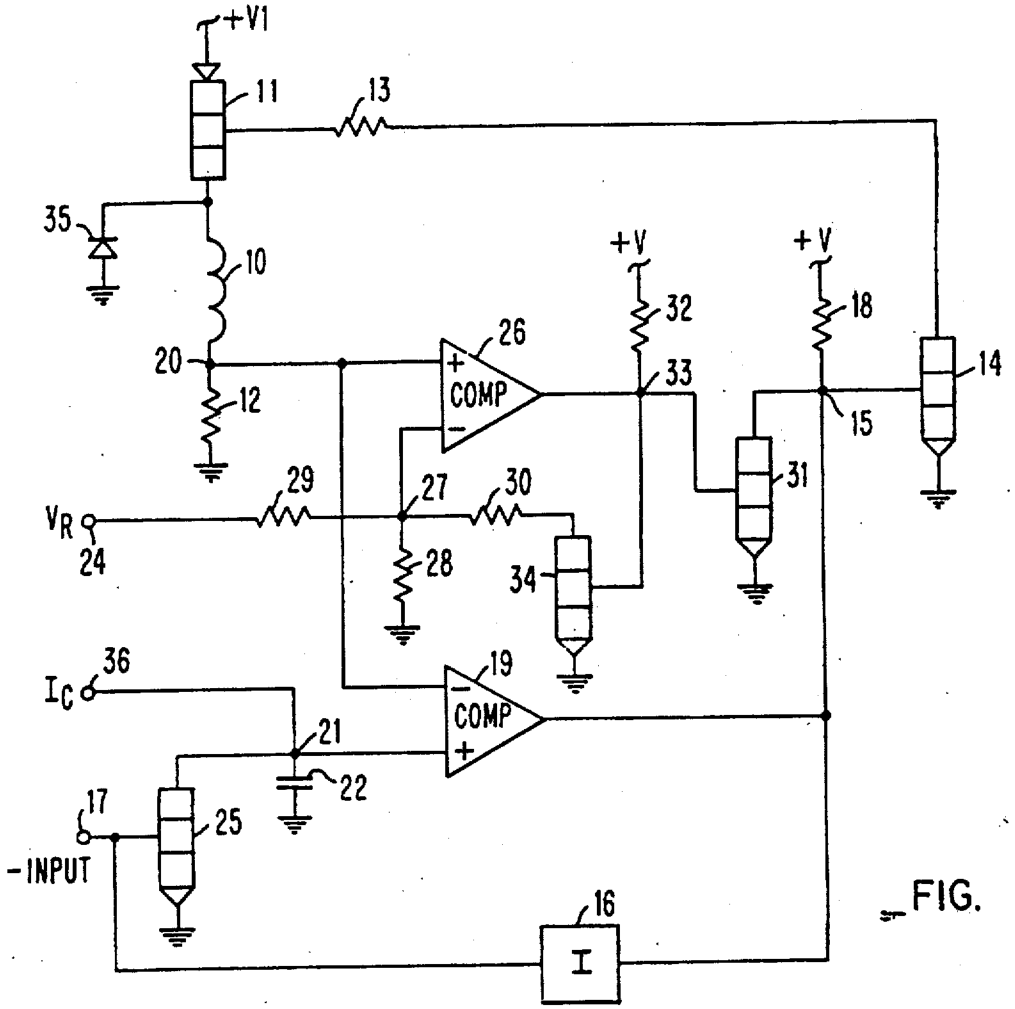
Figure 4:
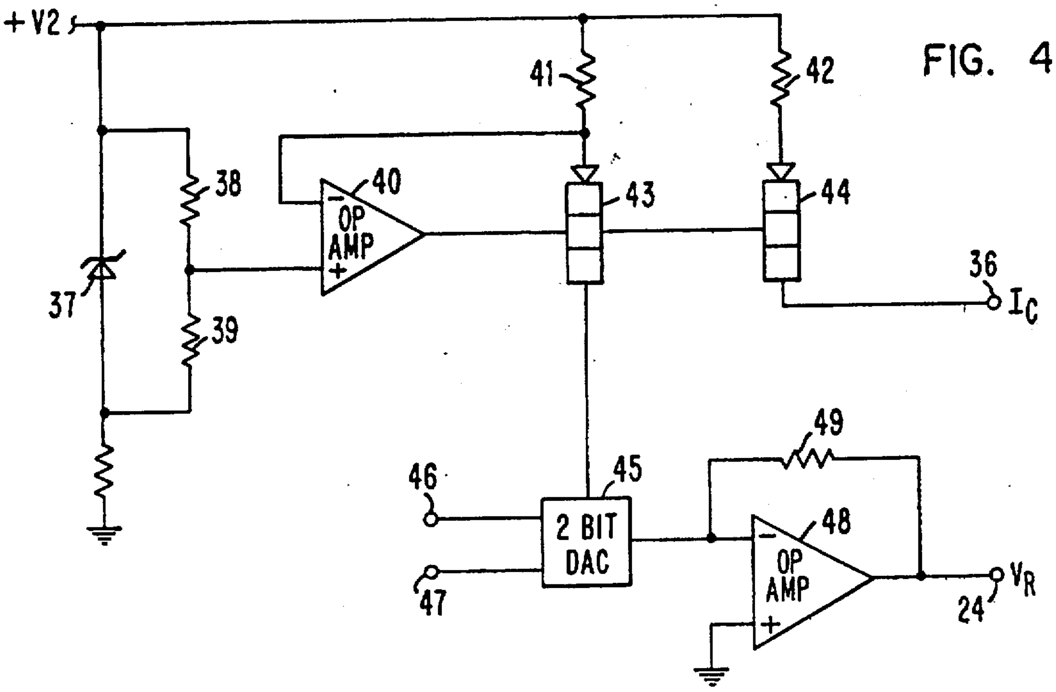

The current source connected to terminal 36 is shown in FIG. 4. In that Figure the Zener diode 37 serves as an accurate reference voltage with respect to a regulated supply +V2. Resistors 38 and 39 drop the reference voltage to a reference applied to the + input of operational amplifier 40 which puts the same voltage drop across emitter resistors 41 and 42 by connection of the output of amplifier 40 to the base of transistors 43 and 44.

The collector of transistor 44 is connected to terminal 36 for supplying charging current $I_c$ to capacitor 22. The other current source transistor 43 has its collector connected to the two bit DAC 45 which has an input connected to receive impression control inputs at terminals 46 and 47. The output of DAC 45 is connected to the operational amplifier 48 having a grounded + input with a feedback connection through resistor 49 to the − input. The output from operational amplifier 48 is connected to terminal 24 to supply the fixed reference voltage $V_R$ for controlling the cycling levels of comparator 26 as previously described. DAC 45 functions upon receipt of binary combinations of input signals at terminals 46 and 47 to increase or decrease the level of the reference voltage $V_R$ thereby providing a convenient means for controlling the energy level supplied to the coil 10.

In a specific current source circuit, the following parameters apply. Operational amplifiers 40 and 48 were 324 operational amplifiers described in National Semiconductor Linear Datebook manufactured by National Semiconductor. Resistors 38 and 39 each had a 3 KΩ rating. Current source transistors are 2N717 transistors manufactured by Texes Instruments and described in Transistor and Diode Datebook. Resistors 41 and 42 were 1.5 KΩ and 15 KΩ respectively. DAC 45 was an 8 bit MC1408 digital-to-analog converter manufactured by Motorola with the two most significant bits used and the other six tied inactive. Resistor 49 in the feedback circuit for operational amplifier 48 was 3 KΩ. With this circuit the ramp voltage supplied by capacitor 22 to the + input of comparator 19 had a rise time of 7400 V per second. This is a ramp current for the parameters indicated of $1.48\times10^4$ amp/sec. With this circuit a 6 A peak is reachable after 400 $\mu$S.

With the above indicated digital-to-analog converter, impression control inputs were combinable to produce discrete reference voltage level in 1 V increments from 3 V to 6 V.

Thus it will be seen that a much simplified drive circuit has been provided for controlling the constant energy to be supplied to the coil of an electromagnetic actuator for a print hammer or the like. Since the amount of energy can be controlled to be constant both during the rise time and the steady state portion of the operating interval, a constant energy can be delivered every time. This makes control and operation of the actuator very precise and in print hammers greatly increases print quality.

We claim:

1. In combination with a coil of an electromagnetic actuator for a print hammer or the like, a drive circuit for supplying a fixed amount of energy to said coil comprising switch means operable in a cyclical manner for connecting said coil alternately to a supply voltage source to energize said coil and to a grounding circuit to deenergize said coil, means for enabling said switch means for connecting said coil to said supply voltage source for an operating interval of fixed duration, said operating interval having a fixed rise time portion followed by a remaining portion, first circuit means operable in response to rising current in said coil for cycling said switch means at a first switching frequency as determined by a rising reference signal during said fixed rise time portion of said operating interval, and second circuit means responsive to first and second peak current levels in said coil as determined by alternating first and second peak reference signals for cycling said switch means at a second switching frequency so as to maintain a desired average current in said coil during said remaining portion of said operating interval.

2. In the combination of claim 1, a drive circuit in which said first circuit means includes a first comparison means for comparing said rising current in said coil with said rising reference signal, said first comparison means producing a first switching signal for cycling said switch means during said fixed rise time interval at said first switching frequency dependent on the rate of increase of said rising current in said coil relative to the rate of increase of said rising reference signal, and said second circuit means includes a second comparison means for comparing said first and second peak current levels in said coil with said alternating first and second peak reference signals, said second comparison means producing a second switching signal for cycling of said switch means at said second switching frequency.

3. In the combination of claim 2, a drive circuit which further includes waveform generating means for supplying said rising reference signal to said first comparison means, and said rising reference signal from said waveform generating means increases at a predetermined rate to said first peak reference signal during said fixed rise time portion of said operating interval.

4. In the combination of claim 3, a drive circuit in which said rising reference signal from said waveform generating means increases exponentially at said predetermined rate to said first peak reference signal during said fixed rise time portion of said operating interval.

5. In the combination of claim 4, a drive circuit in which said waveform generating means for producing said rising reference signal includes an RC circuit means connected to a predetermined reference voltage, said RC circuit means including means connected to supply said rising reference signal to said first comparison means.

6. In the combination of claim 3, a drive circuit in which said rising reference signal from said waveform generating means increases at a predetermined constant rate to said first peak reference signal during said fixed rise time portion of said operating interval.

7. In the combination of claim 6, a drive circuit in which said waveform generating means includes a constant current source, said current source having a connection to said first comparison means for supplying said rising reference signal at said constant rate.

8. In the combination of claim 1, a drive circuit in which said first switching frequency occurs at a faster repitition rate than said second switching frequency.

9. In the combination of claim 5, a drive circuit in which said RC circuit means includes means connected to supply said alternating first and second peak reference signals to said second comparison means.

10. In the combination of claim 9, a drive circuit in which said RC circuit means is an RC circuit operable to have first and second time constants, said RC circuit being operable at said first time constant for supplying said rising reference signal to said first comparison means and then alternately at said first and second time constants for supplying said alternating first and second peak reference signals to said second comparison means.

11. In the combination of claim 10, a drive circuit in which said RC circuit is operable alternately at said first and second time constants by said second switching signal from said second comparison means for supplying said alternating first and second peak reference signals to said second comparison means.

12. In the combination of claim 11, a drive circuit in which said RC circuit includes a resistor network having a voltage divider portion for connection to a reference voltage and to a capacitor element and a branch resistor portion including a switch element for connecting said branch portion to first and second potentials, said switch element being operable by said second switching signal from said second comparison means for switching said branch resistor portion alternately to said first and second potentials whereby said RC circuit is operable alternately at said first and second time constants.

13. In the combination of claim 7, a drive circuit in which said connection from said constant current source to said first comparison means includes a capacitor circuit element chargeable by said constant current source for supplying said rising reference signal to said first comparison means, and said waveform generating means further includes a resistor network having a voltage divider portion for connection to a reference voltage source and a branch resistor portion including a switch element for connecting said branch portion to first and second potentials, said switch element being operable by said second switching signal from said second comparison means for switching said branch resistor portion alternately to said first and second potentials for supplying said first and second peak reference signals to said second comparison means.

* * * * *

UNITED STATES PATENT AND TRADEMARK OFFICE

CERTIFICATE OF CORRECTION

PATENT NO. : 4,408,129
DATED : October 4, 1983
INVENTOR(S) : Robert W. Arnold et al.

It is certified that error appears in the above-identified patent and that said Letters Patent is hereby corrected as shown below:

The title page should be deleted to appear as per attached title page.

Sheets 1 and 2 of the drawings should be deleted and Sheets 1 and 2 as per attached substituted therefor.

Signed and Sealed this

*Twentieth* Day of *November 1984*

[SEAL]

*Attest:*

GERALD J. MOSSINGHOFF

*Attesting Officer*

*Commissioner of Patents and Trademarks*

United States Patent [19]
Arnold et al.

[11] 4,408,129
[45] Oct. 4, 1983

[54] CONSTANT ENERGY DRIVE CIRCUIT FOR ELECTROMAGNETIC PRINT HAMMERS

[75] Inventors: Robert W. Arnold, Glen Aubrey; Dean W. Skinner, Binghamton, both of N.Y.

[73] Assignee: International Business Machines Corporation, Armonk, N.Y.

[21] Appl. No.: 274,848

[22] Filed: Jun. 18, 1981

[51] Int. Cl.$^3$ ........................ H03K 3/01; H03K 3/26; H03K 17/26; H03K 5/22

[52] U.S. Cl. .................................... 307/270; 307/494; 307/228; 307/240; 328/147

[58] Field of Search ............... 307/270, 240, 297, 494, 307/228; 328/146, 147; 331/111, 143, 113 A

[56] References Cited

U.S. PATENT DOCUMENTS 3,967,182 6/1976 Scott .............................. 331/113 A
4,123,729 10/1978 Buetemeister ...................... 331/111

*Primary Examiner*—John S. Heyman
*Assistant Examiner*—Timothy P. Callahan
*Attorney, Agent, or Firm*—John S. Gasper

[57] ABSTRACT

A constant energy drive circuit comprises two interconnected chopping circuits successively operable to control the current in a coil of an electromagnetic actuator. One chopping circuit operates during the rise time portion of the operating interval, the other operates beginning with the occurrence of a predetermined peak current and for remainder of the operating interval of fixed duration.

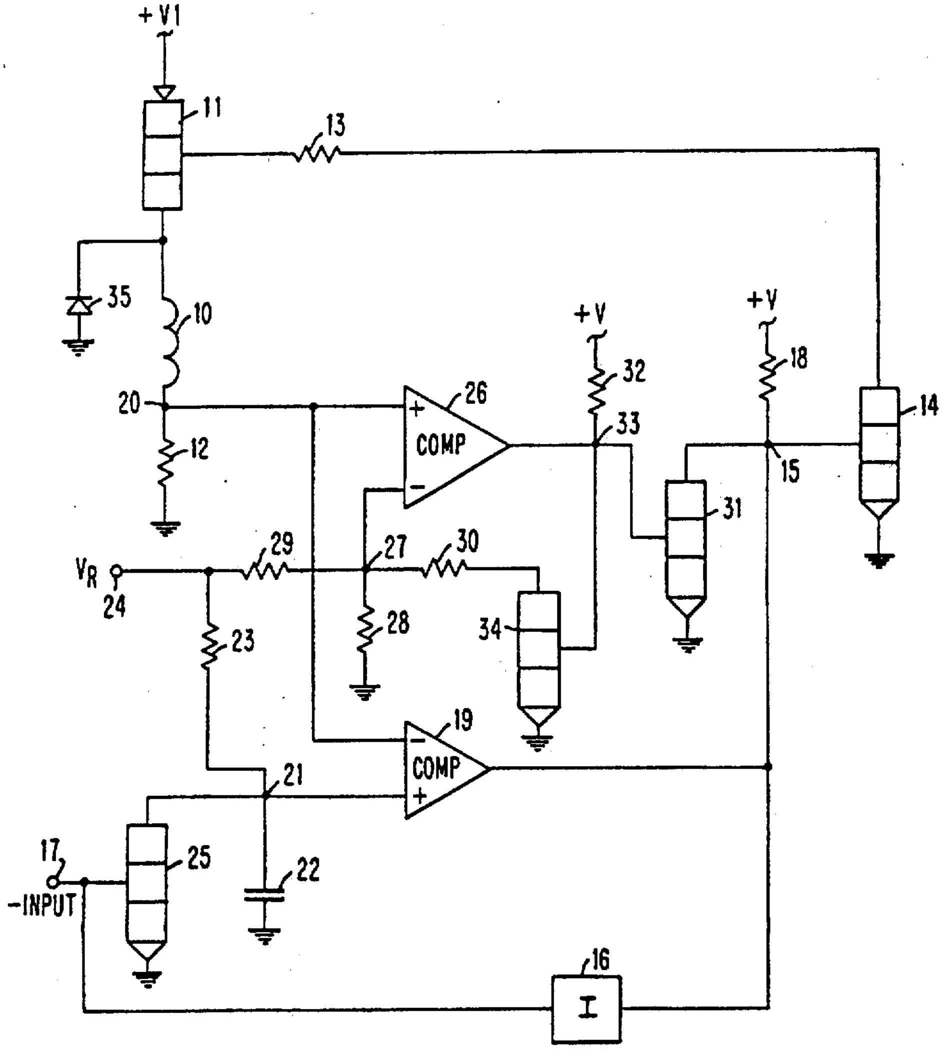

13 Claims, 4 Drawing Figures